United States Patent [19] [11] 4,053,847
Kumahara et al. [45] Oct. 11, 1977

[54] SELF-FEEDBACK TYPE LOW-NOISE CHARGE SENSITIVE AMPLIFIER

[75] Inventors: Tadashi Kumahara; Seturo Kinbara, both of Tokai, Japan

[73] Assignee: Japan Atomic Energy Research Institute, Tokyo, Japan

[21] Appl. No.: 670,099

[22] Filed: Mar. 24, 1976

[30] Foreign Application Priority Data

Mar. 31, 1975 Japan .................................. 50-38692

[51] Int. Cl.² ............................................. H03F 3/16
[52] U.S. Cl. .................................. 330/277; 330/297;
330/294; 330/292; 330/293
[58] Field of Search ................ 330/22, 26, 27, 35,
330/40, 28

[56] References Cited

U.S. PATENT DOCUMENTS 3,611,173 10/1971 Goulding .......................... 330/26 X
3,801,933 4/1974 Teare ............................... 330/27 X Primary Examiner—Rudolph V. Rolinec
Assistant Examiner—Lawrence J. Dahl
Attorney, Agent, or Firm—Stevens, Davis, Miller & Mosher

[57] ABSTRACT

A so-called charge sensitive amplifier is used as a preamplifier for a semiconductor detector. A field-effect transistor (FET) is used as the input stage of the amplifier, wherein the gate terminal of the FET is fed back from the output of the amplifier and the drain terminal of the FET is grounded through a capacitor and connected to a constant current source to make the drain voltage change correspond to the gate potential. The gate potential is self-stabilized.

3 Claims, 5 Drawing Figures

SELF-FEEDBACK TYPE LOW-NOISE CHARGE SENSITIVE AMPLIFIER

In a system for measuring radiation using a semiconductor detector, the level of the output signal of the detector is low and the energy resolution of the detector itself is extremely high, and, therefore, the way to reduce the noise of an amplifier used becomes a great problem. According to the shape and the static capacitance of the semiconductor detector and the variation in the static capacitance due to the applied voltage, a so-called charge sensitive amplifier is widely used as a pre-amplifier for the semiconductor detector. In the charge sensitive amplifier, negative feedback is provided for the input stage by means of a small capacitor so as to give a constant input charge vs. output voltage characteristic irrespective of the variation in capacitance of the detector. In the amplifier, a resistor is generally inserted in parallel with the negative feedback capacitor to give a D.C. negative feedback loop so that no large variation in the biasing condition of the active element in the input stage is brought about in response to variation in the operational condition and the detector bias. A resistor having a high resistance value is used as a negative feedback resistor, but, at present, because of the difficulty of obtaining suitable material and limitations of processes for treating the material, it is difficult to obtain a low-noise resistor.

Therefore, it is naturally preferable in a low-noise amplifier not to use such an unsatisfctory negative feedback resistor and also not to add any particular circuit element to the input terminal of the input stage element. Attempts have been made to reduce amplifier noise, but, in practice, none have proved satisfactory.

This invention relates to a so-called charge sensitive amplifier which uses a field-effect transistor (FET) as the input stage active element of the amplifier. In order to stabilize the biasing condition of the FET, the output voltage of the amplifier is fed back to the gate terminal of the FET and the drain terminal is grounded through a capacitor and is connected to a constant current source.

Before entering into the detailed description of the preferred embodiments of this invention, some charge sensitive amplifiers of the prior art are explained.

Figure 1:
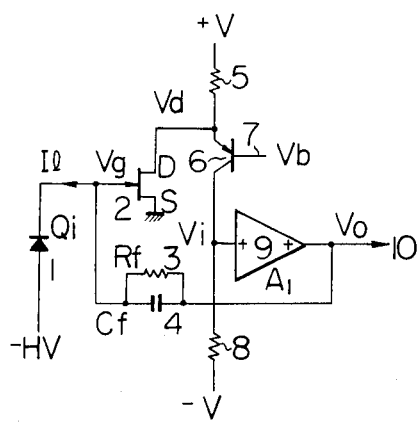
FIG. 1 shows a typical schematic circuit diagram of the charge sensitive amplifier of the prior art in which negative feedback is effected by having a resistor having a high resistance value.

FIG. 1 shows a typical circuit of a charge sensitive amplifier of the prior art. The operation of the circuit shown in FIG. 1 is explained as follows:

The electron charge $Q_i$ generated in radiation detector 1 is accumulated in a dynamic input capacitor and the output voltage $V_o$ of the amplifier is given in equation (1).

$$V_o = -A_o \cdot Q_i / [(1 + A_o)C_f + C_i] \text{ [v]} \quad (1)$$

where $A_o$: open gain of the amplifier
$C_f$: capacitance of negative feedback capacitor 4
$C_i$: total electrostatic capacitance of gate input of the input stage active element including electrostatic capacitance of the detector The open loop gain $A_o$ is given as follows:

$$A_o = -gm \cdot R_c \cdot A_1$$

where gm : mutual conductance of FET 2 in the input stage
$R_c$: collector load resistance of transistor 6 with base electrode grounded
$A_1$ : voltage gain of non-inverting amplifier 9

In the equation (1), if the condition $A_o > 1$ is satisfied, $V_o = Q_i/C_f$ is obtained. This means that the output voltage $V_o$ is proportional to the charge $Q_i$ depending upon the capacitance $C_f$ irrespective of the input capacitance.

In order to establish stable operations irrespective of the changes in the detector current and the operational condition of the amplifier, a D.C. negative feedback is applied thereto. The gate potential of the transistor 2 changes in response to changes in the detector current $I_l$. However, this change is amplified and fed back by a negative feedback resistor $R_f$ so that the gate potential is restored.

The variation $\Delta V_g$ in the gate potential of the transistor 2 is given in the equation (2).

$$\Delta V_g = -R_f \cdot I_l / (1 + A_o) \text{ [v]} \quad (2)$$

The smaller $R_f$ is and the larger $A_o$ is, the more stable the biasing condition of the input active element becomes. As the output D.C. level of the amplifier shifts, then, by $\Delta I_l \cdot R_f$, the value of $R_f$ is determined by the maximum $\Delta I_l$ and the output operational range of the amplifier.

The noise charge (Ern) referred to the input of the amplifier shown in FIG. 1, when a filter made of a pair of resistor and capacitor networks is used, is given in the equation (3).

$$\text{Ern} = 1.2 \times 10^{10} \{[19(I_g + I_l) + 1/R_f] C_i^2/gm\}^{1/2}$$
$$\text{[eV FWHM-Si]} \quad (3)$$

where $I_g$: leakage current in the gate electrode of the FET in the input stage
$C_i$: total input capacitance in the gate electrode of the FET in the input stage including the negative feedback capacitance
$I_l$ : leakage current in the detector
$R_f$: resistance of the negative feedback resistor
gm : mutual conductance of the FET in the input stage A resistor having a resistance value of more than $1 \times 10^9 \Omega$ is generally used as $R_f$ so as to generate of less noise and a resistivity of this order is the limit for present day high resistance resistors with the materials and techniques for treating the materials now available. The present status of the art is a remarkably low noise level cannot be expected, even with a resistor having a resistance value of more than $1 \times 10^{10}\Omega$.

As can be seen from equation (3), when $I_g + I_l$ is of an order of $10^{-10}$A, the effect of the noise which an $R_f$ of an order of $1 \times 10^9 \Omega$ generates and which is contributing to the combined noise is not so large, but when $I_g + I_l$ is smaller than $10^{-12}$A and an ultimate energy resolution is required, the contribution of $R_f$ becomes a factor to limit substantially the resolution. Therefore, it is necessary to stabilize the biasing condition of the active elements in the input stage without using any negative feedback resistor in order to realize a charge sensitive amplifier with lower noise.

Under these conditions, if some elements other than the detector and the negative feedback capacitor are added to the gate circuit of the FET in the input stage, increments in the input capacitance and the leakage current due to the connection of the additional elements cannot be avoided and, therefore, the object of less noise generation cannot be finally attained.

Figure 2:
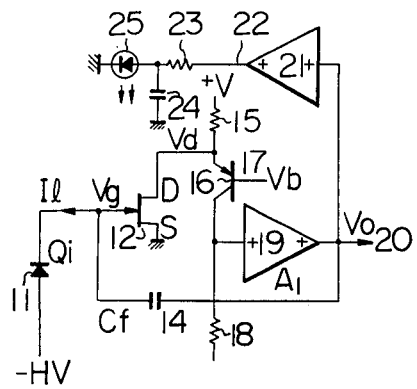
FIG. 2 shows a schematic circuit diagram of an improved optically-coupled feedback type charge sensitive amplifier.

FIG. 2 shows an example of a circuit for the low noise charge sensitive amplifier in which a D.C. negative feedback is obtained by optical coupling. In place of the negative feedback resistor shown in FIG. 1, the input terminal of a circuit 21 for driving a light emitting diode LED 25 is connected to an output terminal 20 of the charge sensitive amplifier and the output terminal 22 of the circuit 21 is connected to the LED 25 through a resistor 23 and a capacitor 24. The LED 25 is optically connected to a field effect transistor 12 in the input stage. The D.C. operation of the circuit shown in FIG. 2 is explained as follows:

When the gate potential of the FET 12 tends to drop in the negative direction due to a change in the detector current Il, the variation $\Delta V_g$ is amplified by D.C. open loop gain $A_o$ to raise the D.C. output level of the charge sensitive amplifier in the positive direction. The change in the D.C. output level raises the D.C. level at the output terminal 22 of the driving circuit 21 to increase the luminous amount of the LED 25 after being delayed by the resistor 23 and the capacitor 24.

Since the LED is set to illuminate the channel of the FET 12, the gate current of the transistor increases with the increment of the illumination to the channel, so that the gate potential of the FET raises in the positive direction. As a series of operations explained above is going on, the biasing condition of the active elements in the input stage will be stabilized according to the D.C. gain in the amplifier circuit and the transfer coefficient in the optical coupling circuit.

According to the circuit shown in FIG. 2, no negative feedback resistor is used and no additional element is connected to the gate circuit of the FET in the input stage. It is said, therefore, that it is superior to any prior art current in stabilizing the gate potential of the transistor. However, since it is necessary to expose the transistor element to combine it with the LED and a detector with extremely luminously high sensitivity to light is set near the LED, there remains some problems as to some limitations in arranging the luminous element, such adequate optical shielding of the detector against the LED.

In addition to the shielding problem as the elements in the input stage, in general, are set in a vacuum-cooled vessel in order to reduce the noise, the minimum number of the elements is used in consideration of the gas discharge and the increment of stray capacitance resulting therefrom. Since the stationary current in the channel is given by $I_g$ in equation (3) and excess illumination apparently becomes a source of noise, it is difficult to determine the appropriate level of illumination and the result is that, in practice, the expected lower noise generation cannot necessarily be obtained. It is shown in the art that an FET is similar in characteristic to an electronic tube, but a junction type FET is a semiconductor element which is different in characteristic from an electronic tube.

Figure 3:
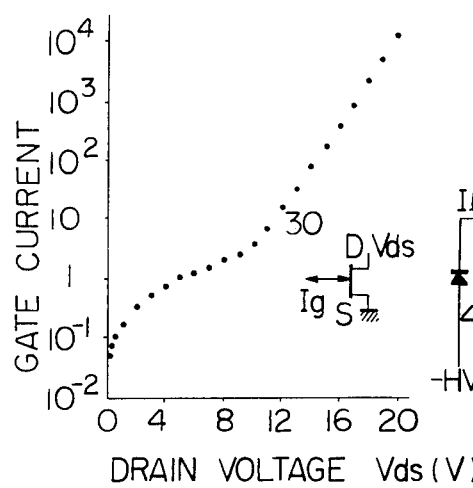
FIG. 3 shows an example of a characteristic curve giving the relation between the drain voltage and the gate current which explains the fundamental theory of this invention.

FIG. 3 shows an example of the resultant measurement of the drain and source voltage vs. gate current characteristics in a junction type FET utilizing the subject invention.

Characteristic curve 30 in FIG. 3 can be expressed by the following equation:

$$I_g = a \cdot Vds^b \, [A] \tag{4}$$

where
$I_g$ : gate current
a,b : factors inherent in the elements
Vds : drain voltage As shown in FIG. 3, with this invention it is possible to stabilize the gate potential of the FET in the input stage by controlling the drain voltage in response to the change in the gate potential of the FET, without using the negative feedback resistor 3 shown in FIG. 1 or the LED 25 shown in FIG. 2 which may introduce some problems when used.

In utilizing positively the inherent characteristics of the FET, it is desirable to separate the path through which signals are given from the control means because applying control signal might give some disturbance to the path resulting in an adverse effect on the control signal.

Figure 4:
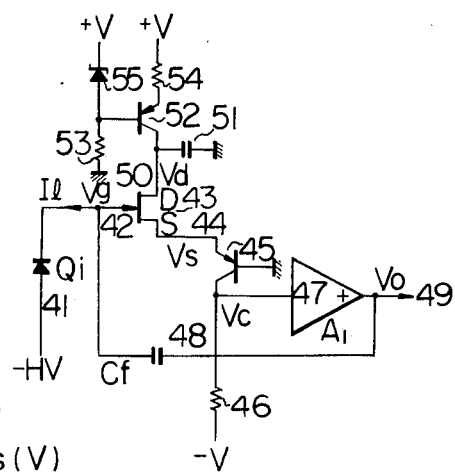
FIG. 4 shows an embodiment of the low-noise charge sensitive amplifier of this invention.

In FIG. 4 which is an embodiment of this invention, a gate terminal 42 of an active element 43 in the input stage, which employs a junction type FET, is connected to the negative electrode of a semiconductor radiation detector 41 and one terminal of a negative feedback capacitor 48. The source terminal 44 of the transistor 43 is connected to the emitter terminal of a transistor 45 with the base terminal grounded. The collector output terminal of the transistor 45 is connected to the input terminal of an inverted type amplifier 47 and to a terminal of a resistor 46 which acts as a load to the transistor 45. The output terminal of the amplifier 47 is connected to the other terminal of the capacitor 48 and an output terminal 49 of the charge sensitive amplifier.

The drain terminal 50 of the FET 43 is connected to a terminal of a capacitor 51 to suppress the voltage change in the drain voltage, with the other terminal of said capacitor 51 being grounded, and to the collector terminal of a constant current source transistor 52. The base terminal of the transistor 52 is connected to a constant voltage source circuit of a voltage more than 20 volts comprising a resistor 53 and a constant voltage diode 55. The emitter terminal of the transistor 52 is connected to a positive voltage source through a resistor 54.

The operation of the circuit shown in FIG. 4 is explained as follows:

The output current from the constant current source circuit is set so as to apply normally a voltage of about 4 to 6 volts to the drain terminal 50 of the FET 43. When the gate potential $V_g$ of the FET 43 tends to drop in the negative direction due to the increment in the detector current Il, the drain current variation $\Delta I_d$ is expressed in the following equation:

$$\Delta I_d = \Delta V_g \cdot gm + Vbe \cdot gm \ [A] \quad (5)$$

where
- gm : mutual conductance of the FET in the input stage
- $\Delta V_g$: variation in the gate potential
- Vbe: voltage between the base and emitter electrodes in the transistor 45

In the equation (5), since the mutual conductance gm is substantially constant in the stationary operating region and the voltage Vbe is constant in the same region, the drain current changes in proportion to the gate potential and decreases by $\Delta Vg\ gm$ due to the change in the negative gate potential. As the load in the drain circuit is the constant current a source circuit, decrease in the drain current results in an increase in the drain voltage and, as shown in the characteristic curve 30 in FIG. 3, it results in an increase in the gate current. As the result of the operation explained above, the gate potential of the FET is restored and stabilized at a balanced condition where the detector current Il becomes equal to the gate current $I_g$.

The high frequency open loop gain $A_o$ in FIG. 4 can be expressed in the equation (6), since the voltage Vbe of the transistor 45 can be ignored.

$$A_o = gm \cdot R_c \cdot A_1 \quad (6)$$

where
- gm : mutual conductance of the FET in the input stage
- $R_c$ : resistance of the load to the transistor 45
- $A_1$ : voltage gain of the amplifier 47

The amplitude of the output signal can be obtained by entering equation (6) into equation (1) and the amplitude at the output terminal 49 becomes proportional to the input electron charge under the condition $A_o > 1$.

In conclusion, therefore, the charge sensitive amplifier shown in FIG. 4 has substantially little noise since no negative feedback resistor shown in FIG. 1 is utilized, and is free from problems of constructional limitation of the input stage elements since no LED shown in FIG. 2 is utilized. The amount of D.C. feedback during ambient condition can easily be determined by measuring the drain voltage of the FET in the input stage so the amplifier can be set in the most appropriate condition and no increase noise in due to excess D.C. feedback will be brought about.

In the circuit shown in FIG. 4, the control signal cannot disturb the signal circuit since the signal circuit is separated from the control means, and the gate potential of the FET can effectively be stabilized through the direct application system. As to the signal circuit, the source output current from the FET is effectively delivered through the transistor with the base electrode grounded so that the conversion gain of the FET is not decreased and the signal-noise ratio is not impaired.

In the embodiment, a PNP transistor is used as the transistor with the base electrode grounded but it will be apparent that an NPN transistor can be substituted for the PNP transistor.

Figure 5:
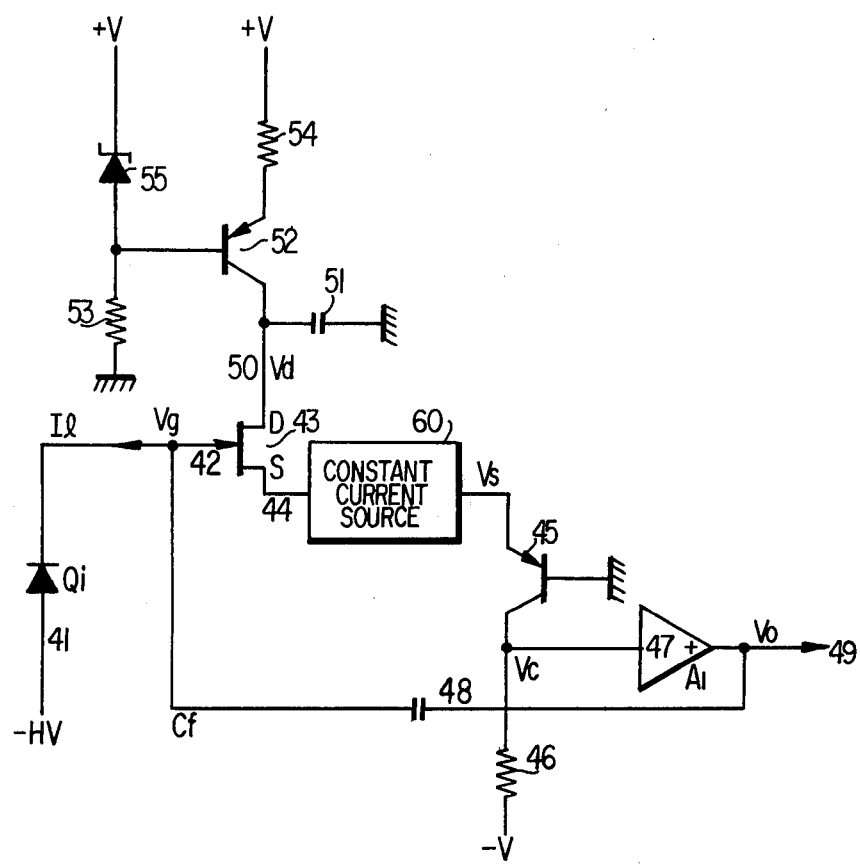
FIG. 5 is an embodiment which is the same as that of FIG. 4 except for the addition of a constant current source.

It will be also apparent to make the bias current of the transistor with the base electrode grounded most appropriate by adding a constant current source circuit 60 to the source load circuit between the source electrode 44 of FET 50 and the emitter of transistor 45. This is shown in FIG. 5 which is identical to FIG. 4 except for the addition of the constant current source circuit 60.

An example of the transistor constant current circuit is shown in FIG. 4 as the drain load of the FET, but any other circuit can be used as the load. It will naturally be noted that the overall polarity can be reversed from that shown in FIG. 4.

We claim:

1. A self-feedback low-noise charge sensitive amplifier comprising
    an input stage including a junction type field-effect transistor (FET) as the active element thereof, said FET having source, drain and gate terminals,
    a transistor having an emitter electrode coupled to the source terminal of said FET, a base electrode connected to ground and a collector electrode,
    an amplifier having an input terminal connected to the collector electrode of said transistor and an output terminal coupled to the gate terminal of said FET, and
    a capacitor having one end grounded and the other end connected to the drain terminal of said FET, said capacitor stabilizing the gate potential of said FET and changing the drain terminal voltage of said FET in response to a change in the potential at the gate terminal of said FET.

2. A self-feedback low-noise charge sensitive amplifier as defined in claim 1, wherein the drain terminal of said FET is further connected to a constant current source.

3. A self-feedback low-noise charge sensitive amplifier as defined in claim 1, wherein a constant current source circuit is interposed between the source terminal of said FET and the emitter electrode of said transistor.

* * * * *